(12) United States Patent
Stokes et al.

(10) Patent No.: US 11,336,256 B2
(45) Date of Patent: May 17, 2022

(54) WLP BAW DEVICE WITH OXIDE ADHESION LAYER

(71) Applicant: Qorvo US, Inc., Greensboro, NC (US)

(72) Inventors: Paul Stokes, Orlando, FL (US);
Thomas Russell, McKinney, TX (US);
Erika Fuentes, Richardson, TX (US)

(73) Assignee: QORVO US, INC., Greensboro, NC (US)

( * ) Notice: Subject to any disclaimer, the term of this patent is extended or adjusted under 35 U.S.C. 154(b) by 738 days.

(21) Appl. No.: 16/275,763

(22) Filed: Feb. 14, 2019

(65) Prior Publication Data

US 2020/0014364 A1 Jan. 9, 2020

Related U.S. Application Data

(60) Provisional application No. 62/694,494, filed on Jul. 6, 2018.

(51) Int. Cl.
*H03H 9/05* (2006.01)
*H03H 9/17* (2006.01)
*H03H 9/10* (2006.01)

(52) U.S. Cl.
CPC .......... *H03H 9/0514* (2013.01); *H03H 9/105* (2013.01); *H03H 9/175* (2013.01)

(58) Field of Classification Search
CPC ..... H03H 9/0105; H03H 9/0514; H03H 9/175
See application file for complete search history.

(56) References Cited

U.S. PATENT DOCUMENTS

| 2012/0293278 A1* | 11/2012 | Burak | H03H 9/173 |
| | | | 333/189 |
| 2019/0109561 A1* | 4/2019 | Bahr | H03B 5/1296 |

* cited by examiner

*Primary Examiner* — Jeffrey M Shin
(74) *Attorney, Agent, or Firm* — Withrow & Terranova, P.L.L.C.

(57) ABSTRACT

The present disclosure relates to a wafer-level packaged (WLP) bulk acoustic wave (BAW) device, which includes a BAW resonator and a WLP enclosure. The BAW resonator includes a piezoelectric layer with an interface opening, a bottom electrode lead underneath the interface opening, an interface structure extending over the interface opening and connected with the bottom electrode lead, a passivation layer with a passivation opening over the interface structure, and an oxide adhesion layer with an adhesion opening over the passivation layer. The WLP enclosure includes an outer wall directly residing over the oxide adhesion layer, and a through-WLP via encompassed by the outer wall and vertically aligned with the adhesion opening and the passivation opening. A portion of the interface structure is exposed to the through-WLP via through the adhesion opening and the passivation opening.

31 Claims, 8 Drawing Sheets

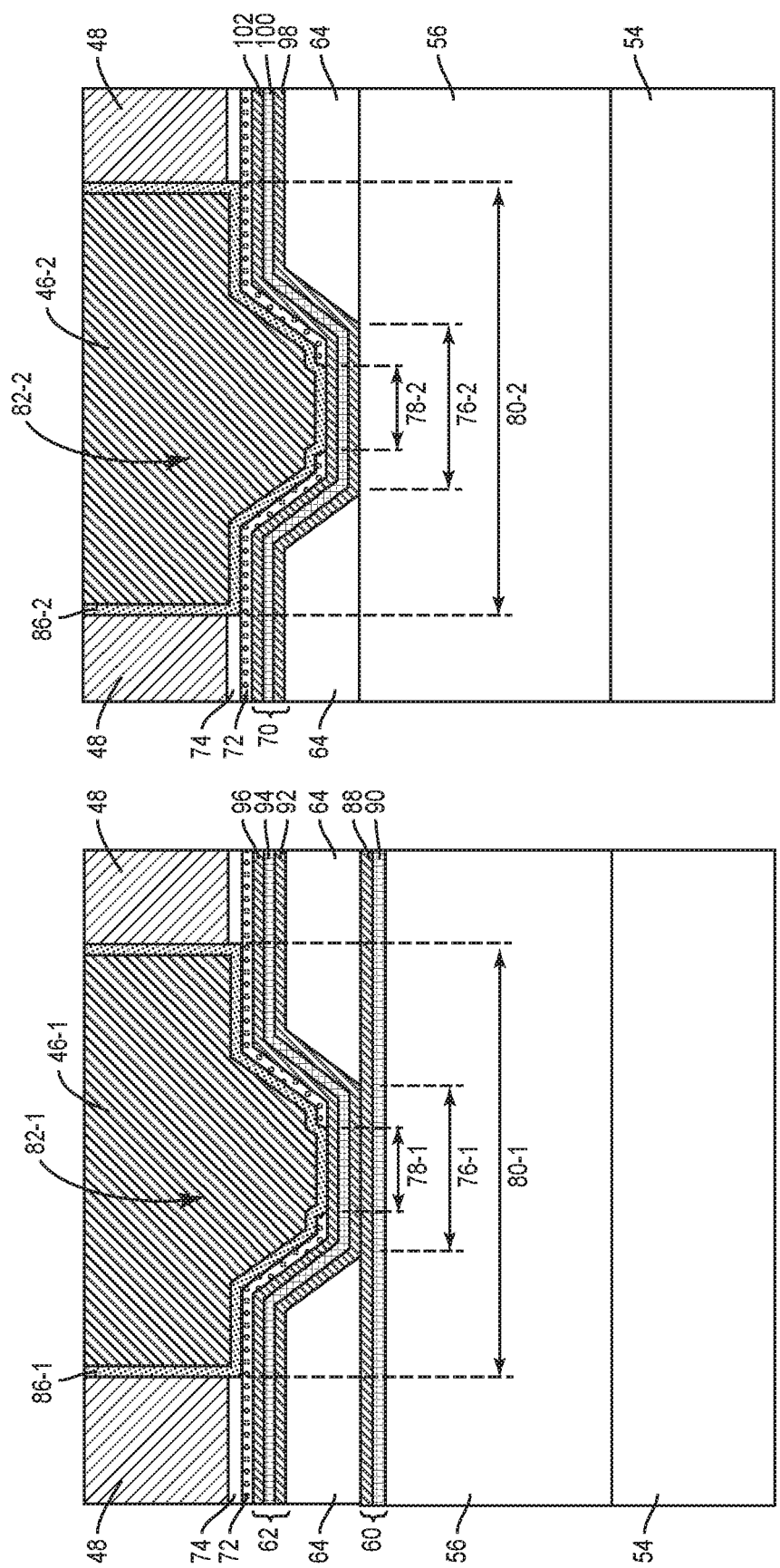

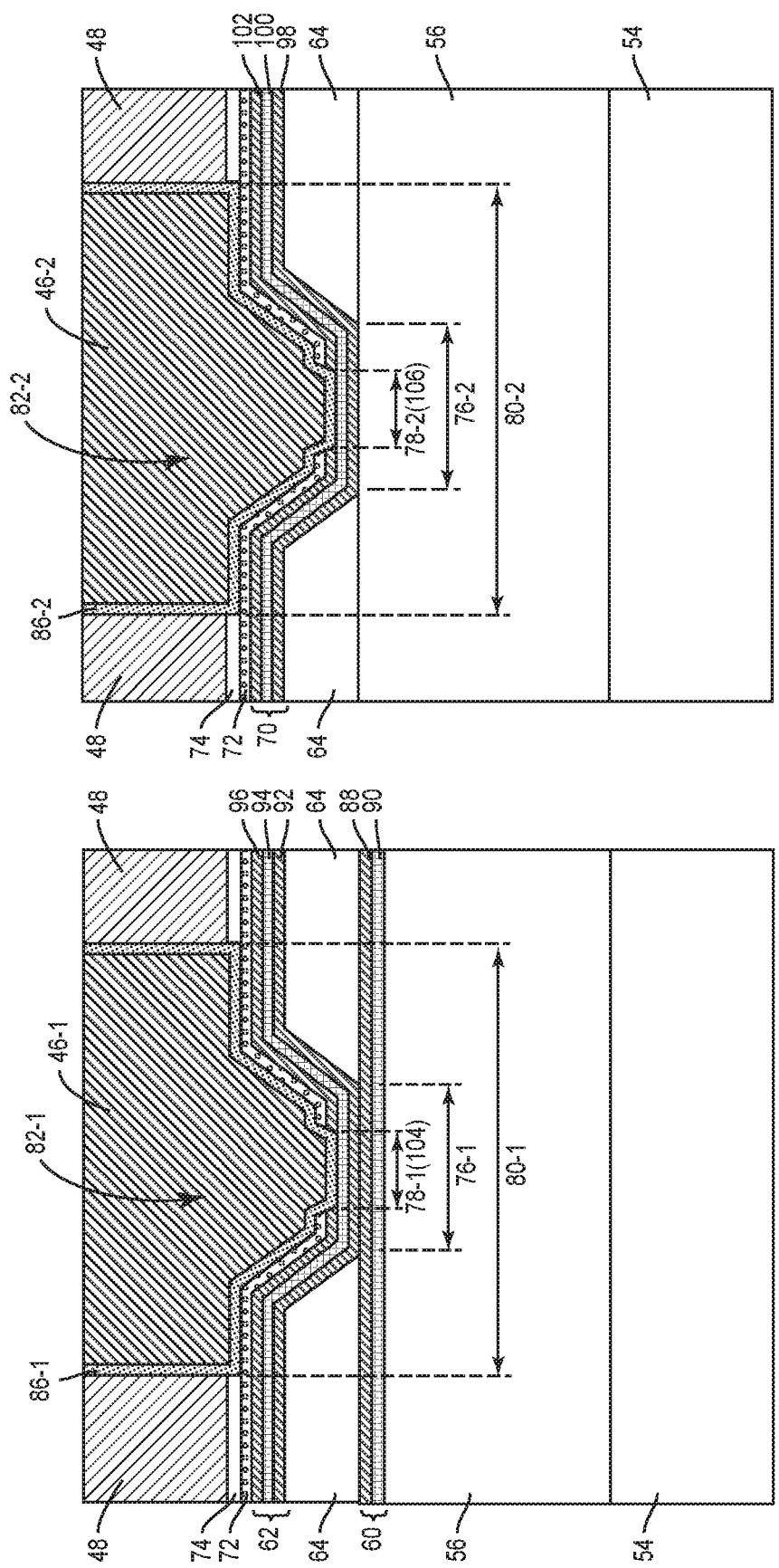

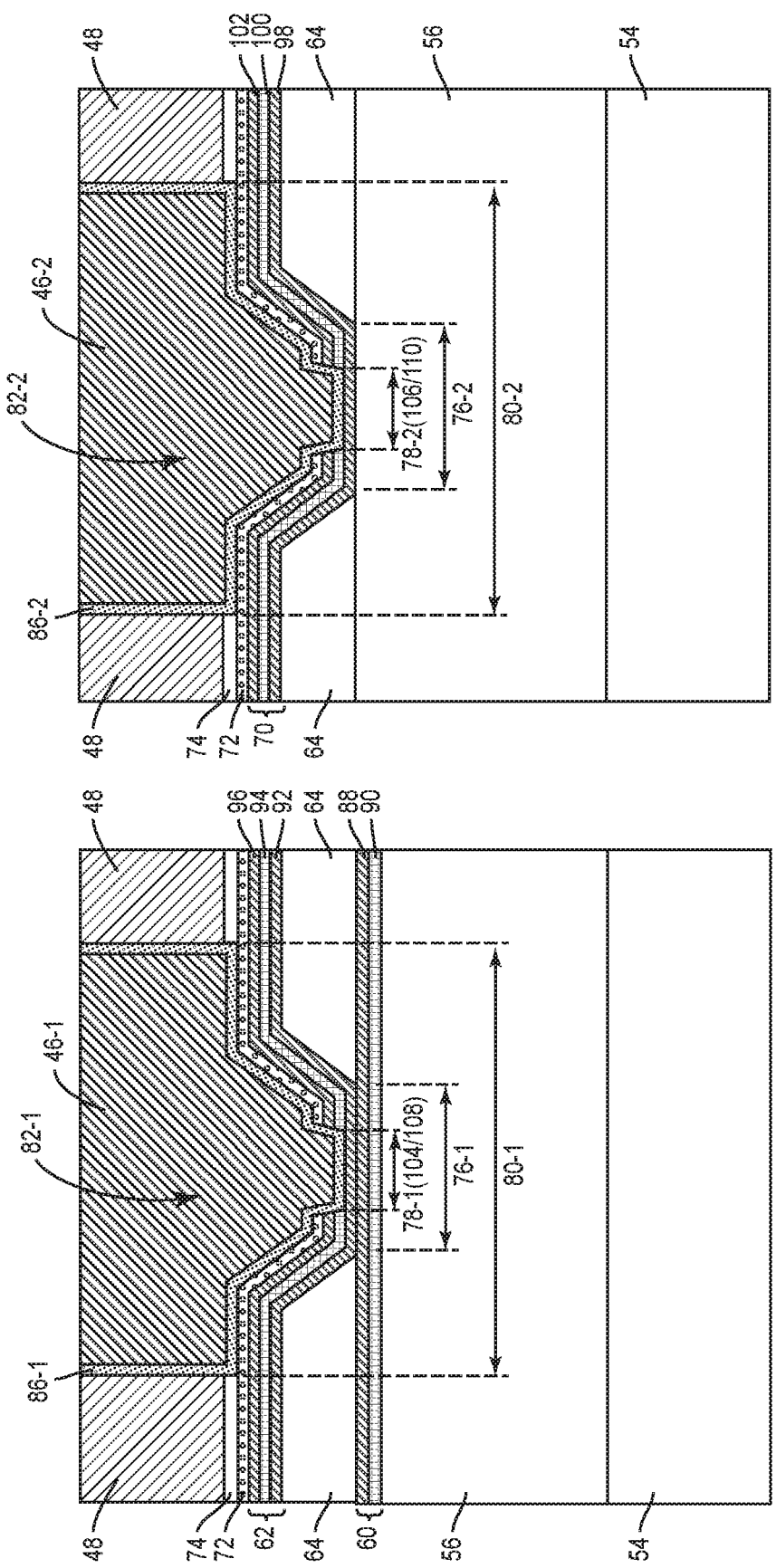

WLP BAW DEVICE WITH OXIDE ADHESION LAYER

RELATED APPLICATIONS

This application claims the benefit of provisional patent application Ser. No. 62/694,494, filed Jul. 6, 2018, the disclosure of which is hereby incorporated herein by reference in its entirety.

FIELD OF THE DISCLOSURE

The present disclosure relates to a wafer-level packaged (WLP) bulk acoustic wave (BAW) device, and in particular to a WLP BAW device with an oxide adhesion layer for superior adhesion between a WLP enclosure and BAW resonators.

BACKGROUND

Due to their small size, high Q values, and very low insertion losses at microwave frequencies, particularly those above 1.5 Gigahertz (GHz), bulk acoustic wave (BAW) devices have been widely used in modern wireless applications. For instance, BAW filters are the filter of choice for many $3^{rd}$ Generation (3G) and $4^{th}$ Generation (4G) wireless devices, and are destined to dominate filter applications for 5th Generation (5G) wireless devices. The low insertion loss of the BAW filter provides many advantages such as improved battery life, and compensation for higher losses associated with the need to support many frequency bands in a single mobile device, etc.

Figure 1:
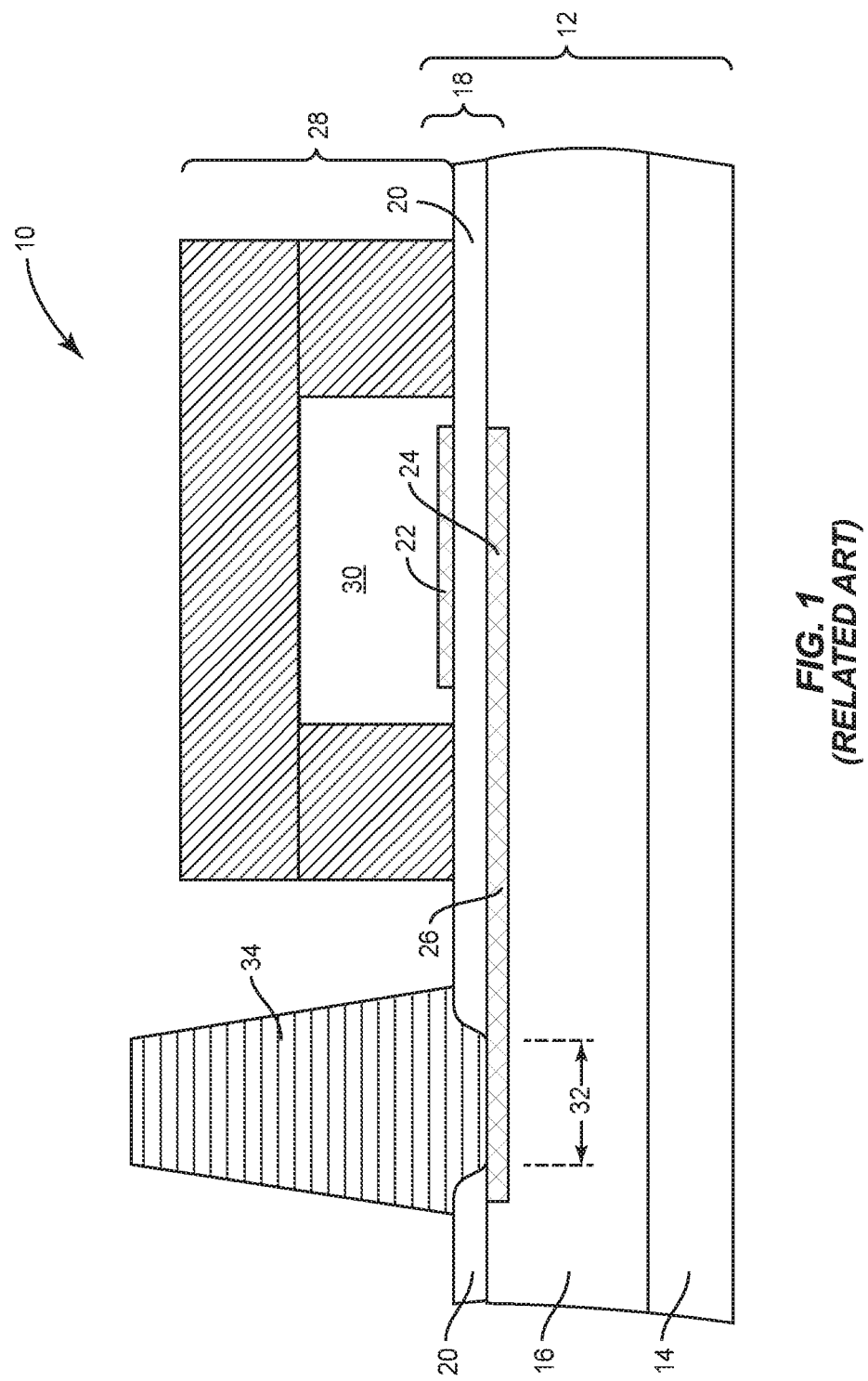

One example of a conventional wafer-level-packaged (WLP) BAW device 10 is illustrated in FIG. 1. The BAW device 10 includes a BAW resonator 12 that has a substrate 14, a reflector 16 over the substrate 14, and a transducer 18 over the reflector 16. The reflector 16 is typically formed by a stack of reflector layers (not shown), which alternate in material composition to produce a significant reflection coefficient at the junction of adjacent reflector layers. The transducer 18 includes a piezoelectric layer 20, which is sandwiched between a top electrode 22 and a bottom electrode 24. The transducer 18 may also include a bottom electrode lead 26, which resides underneath the piezoelectric layer 20 and is connected to the bottom electrode 24.

In order to protect BAW resonators from external elements (such as moisture, contamination, etc.), housings, also known as WLP walls and caps, are applied to enclose the BAW resonators. In this example, the BAW device 10 includes a WLP enclosure 28, which is connected to the piezoelectric layer 20 to encapsulate the top electrode 22 of the BAW resonator 12 within a cavity 30. In addition, the piezoelectric layer 20 has an opening 32 outside the WLP enclosure 28, where a portion of the bottom electrode lead 26 is exposed through the opening 32 of the piezoelectric layer 20. A copper pillar connection 34 is connected to the exposed portion of the bottom electrode lead 26 to provide an external electrical connection for the BAW device 10.

Because of the processing constraints, there are space requirements between the WLP enclosure 28 and the copper pillar connection 34. In addition, the round shape of the copper pillar connection 34 will also take up a significant area of device space. As such, the opening 32 of the piezoelectric layer 20 needs to be relatively far away from the WLP enclosure 28 to accommodate the copper pillar connection 34. If a BAW device has multiple BAW resonators and multiple copper pillar connections, the BAW device is associated with a large cross-sectional area. In addition, the WLP enclosure 28 is required to be adhered to the piezoelectric layer 20 tightly; otherwise chemicals/mold compound in the following process may intrude into the cavity 30 and thus shift the performance of the resonator 12.

Accordingly, there remains a need for improved BAW device designs to reduce the device size without affecting the external electrical connection of the BAW device. Further, there is also a need to achieve superior adhesion between the WLP enclosure and the BAW resonator for reliable performance.

SUMMARY

The present disclosure relates to a wafer-level packaged (WLP) bulk acoustic wave (BAW) device, which includes a piezoelectric layer with a first interface opening, a bottom electrode, a bottom electrode lead extending from the bottom electrode, a first interface structure, a WLP enclosure with a first through-WLP via, a passivation layer, and an oxide adhesion layer. The bottom electrode and the bottom electrode lead are formed over a bottom surface of the piezoelectric layer, and a portion of the bottom electrode lead is exposed through the first interface opening of the piezoelectric layer. The first interface structure extends over the first interface opening, and is in contact with the exposed portion of the bottom electrode lead. The WLP enclosure includes a WLP cap and an outer wall, which extends from the WLP cap toward the top surface of the piezoelectric layer to form a cavity. The first through-WLP via extends vertically through the WLP cap and the outer wall, and is encompassed by the outer wall. The passivation layer, which is formed of Silicon Nitride (SiN), resides directly over a portion of the top surface of the piezoelectric layer and having a first passivation opening over the first interface structure. And the oxide adhesion layer resides directly over at least a portion of the passivation layer and has a first adhesion opening. Herein, the first through-WLP via, the first adhesion opening, and the first passivation opening are vertically aligned, such that at least a portion of the first interface structure is exposed to the first through-WLP via through the first passivation opening and the first adhesion opening. The outer wall is confined within the oxide adhesion layer, such that a bottom surface of the outer wall is in contact with the oxide adhesion layer.

According to another embodiment, the WLP BAW device further includes a top electrode that resides over a top surface of the piezoelectric layer and within the cavity. Herein, the top surface of the piezoelectric layer is opposite the bottom surface of the piezoelectric layer. An active region for a resonator is formed where the bottom electrode and the top electrode overlap.

In one embodiment of the WLP BAW device, the passivation layer is further directly over exposed surfaces of the top electrode.

In one embodiment of the WLP BAW device, the oxide adhesion layer fully covers the passivation layer.

In one embodiment of the WLP BAW device, the oxide adhesion layer does not fully cover the passivation layer.

In one embodiment of the WLP BAW device, the oxide adhesion layer is formed of Silicon oxide or oxynitride.

In one embodiment of the WLP BAW device, a thickness of the oxide adhesion layer is between 50 Å and 75 Å.

In one embodiment of the WLP BAW device, a thickness of the oxide adhesion layer is between 20 Å and 900 Å.

In one embodiment of the WLP BAW device, a width of the first passivation opening is essentially the same as a width of the first adhesion opening, and is no greater than a width of the first interface opening.

In one embodiment of the WLP BAW device, a thickness of the passivation layer is between 10 Å and 5000 Å.

According to another embodiment, the WLP BAW device further includes a first interconnect formed in the first through-WLP via and electrically connected to the first interface structure.

In one embodiment of the WLP BAW device, the first interconnect is formed of copper (Cu), Tin (Sn), or Tin Silver (SnAg).

According to another embodiment, the WLP BAW device further includes a first seed layer. Herein, the first seed layer continuously extends over exposed surfaces within the first through-WLP via, such that the first seed layer is in contact with the exposed portion of the first interface structure through the first adhesion opening and the first passivation opening. The first interconnect is formed over the first seed layer.

In one embodiment of the WLP BAW device, the first seed layer is formed of Titanium (Ti) or Titanium Tungsten (TiW).

According to another embodiment, the WLP BAW device further includes a top electrode, a top electrode lead, and a second interface structure. Herein, the piezoelectric layer further includes a second interface opening, the WLP enclosure further includes a second through-WLP via, the passivation layer further includes a second passivation opening, and the oxide adhesion layer further includes a second adhesion opening. The top electrode and the top electrode lead are formed over the top surface of the piezoelectric layer, and the top electrode lead extends from the top electrode. The second interface structure extends from the top electrode lead, and extends over the second interface opening of the piezoelectric layer. The second through-WLP via extends vertically through the WLP cap and the outer wall, and is encompassed by the outer wall. The second through-WLP via, the second adhesion opening, and the second passivation opening are vertically aligned, and over the second interface structure, such that at least a portion of the second interface structure is exposed to the second through-WLP via through the second passivation opening and the second adhesion opening.

In one embodiment of the WLP BAW device, the passivation layer is directly over exposed surfaces of the top electrode and the top electrode lead.

According to another embodiment, the WLP BAW device further includes a first interconnect formed in the first through-WLP via and electrically connected to the first interface structure, and a second interconnect formed in the second through-WLP via and electrically connected to the second interface structure.

According to another embodiment, the WLP BAW device further includes a first seed layer and a second seed layer. Herein, the first seed layer continuously extends over exposed surfaces within the first through-WLP via, such that the first seed layer is in contact with the exposed portion of the first interface structure through the first passivation opening and the first adhesion opening. The first interconnect is formed over the first seed layer. The second seed layer continuously extends over exposed surfaces within the second through-WLP via, such that the second seed layer is in contact with the exposed portion of the second interface structure through the second passivation opening and the second adhesion opening. The second interconnect is formed over the second seed layer.

In one embodiment of the WLP BAW device, the first interface structure includes a lower interface layer, a middle interface layer, and an upper interface layer. The lower interface layer extends over the first interface opening of the piezoelectric layer and is in contact with the exposed portion of the bottom electrode lead. The middle interface layer is formed over the lower interface layer, and the upper interface layer is formed over the middle interface layer. A portion of the upper interface layer is exposed to the first through-WLP via through the first passivation opening and the first adhesion opening. Herein, the lower interface layer is formed of Tungsten (W) or Molybdenum (Mo), the middle interface layer is formed of Aluminum Copper (AlCu), and the upper interface layer is formed of W or Mo. The lower interface layer has a thickness between 100 Å and 10000 Å, the middle interface layer has a thickness between 100 Å and 10000 Å, and the upper interface layer has a thickness between 100 Å and 10000 Å.

In one embodiment of the WLP BAW device, the bottom electrode and the bottom electrode lead are formed from a common first bottom electrode layer and a common second bottom electrode layer. The first bottom electrode layer is formed over the bottom surface of the piezoelectric layer, and a portion of the first bottom electrode layer is in contact with the lower interface layer of the first interface structure through the first interface opening of the piezoelectric layer. The second bottom electrode layer is formed underneath the first bottom electrode layer. Herein, the first bottom electrode layer is formed of W or Mo, and the second bottom electrode layer is formed of AlCu. The first bottom electrode layer has a thickness between 100 Å and 10000 Å, and the second bottom electrode layer has a thickness between 100 Å and 10000 Å.

In one embodiment of the WLP BAW device, the first interface structure includes a lower interface layer, a middle interface layer, and an upper interface layer. The lower interface layer extends over the first interface opening of the piezoelectric layer and is in contact with the exposed portion of the bottom electrode lead. The middle interface layer is formed over the lower interface layer, and the upper interface layer with a layer opening formed over the middle interface layer. The layer opening of the upper interface layer is vertically aligned with the first passivation opening and the first adhesion opening, and has essentially a same size as the first passivation opening. A portion of the middle interface layer is exposed to the first through-WLP via of the WLP enclosure through the layer opening of the upper interface layer, the first passivation opening, and the first adhesion opening. Herein, the lower interface layer is formed of W or Mo, the middle interface layer is formed of AlCu, and the upper interface layer is formed of W or Mo.

In one embodiment of the WLP BAW device, the first interface structure includes a lower interface layer, a middle interface layer, and an upper interface layer. The lower interface layer extends over the first interface opening of the piezoelectric layer and is in contact with the exposed portion of the bottom electrode lead. The middle interface layer with a first layer opening is formed over the lower interface layer, and the upper interface layer with a second layer opening is formed over the middle interface layer. The first layer opening of the middle interface layer and the second layer opening of the upper interface layer are vertically aligned with the first passivation opening and the first adhesion opening. The first layer opening of the middle interface layer and the second layer opening of the upper interface layer have essentially a same size as the first passivation opening. The portion of the lower interface layer is exposed to the first through-WLP via of the WLP enclosure through the first layer opening of the middle interface layer, the second layer opening of the upper interface layer, the first passivation opening, and the first adhesion opening. Herein, the lower interface layer is formed of W or Mo, the middle interface layer is formed of AlCu, and the upper interface layer is formed of W or Mo.

According to another embodiment, a WLP BAW device includes a piezoelectric layer with an interface opening, a top electrode, a top electrode lead extending from the top electrode, an interface structure, a WLP enclosure with a first through-WLP via, a passivation layer, and an oxide adhesion layer. The top electrode and the top electrode lead reside over the top surface of the piezoelectric layer. The interface structure extends from the top electrode lead, and extends over the interface opening. The WLP enclosure includes a WLP cap and an outer wall, which extends from the WLP cap toward the top surface of the piezoelectric layer to form a cavity. The top electrode resides in the cavity. The through-WLP via extends vertically through the WLP cap and the outer wall, and is encompassed by the outer wall. The passivation layer, which is formed of SiN, resides directly over the top electrode, the top electrode lead, and a portion of the top surface of the piezoelectric layer. The passivation layer has a passivation opening over the interface structure. The oxide adhesion layer resides directly over at least a portion of the passivation layer and has a adhesion opening. The through-WLP via, the adhesion opening, and the passivation opening are vertically aligned, such that at least a portion of the interface structure is exposed to the through-WLP via through the passivation opening and the adhesion opening. The outer wall is confined within the oxide adhesion layer, such that a bottom surface of the outer wall is in contact with the oxide adhesion layer.

In one embodiment of the WLP BAW device, the top electrode, the top electrode lead, and the interface structure are formed from a common first top electrode layer, a common second top electrode layer, and a common third top electrode layer. Herein, the first top electrode layer extends over a portion of the top surface of the piezoelectric layer and over the interface opening. The second top electrode layer is formed over the first top electrode layer, and the third top electrode layer is formed over the second top electrode layer. A portion of the third top electrode layer is exposed to the through-WLP via through the passivation opening and the adhesion opening. Herein, the first top electrode layer is formed of W or Mo, the second top electrode layer is formed of AlCu, and the third top electrode layer is formed of W or Mo.

According to another embodiment, the WLP BAW device further includes a seed layer and an interconnect. The seed layer continuously extends over exposed surfaces within the through-WLP via, such that the seed layer is in contact with the exposed portion of the interface structure through the passivation opening and the adhesion opening. The interconnect is formed over the seed layer, such that the interconnect is electrically connected to the interface structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a conventional wafer-level-packaged (WLP) bulk acoustic wave (BAW) device.

Figure 2A:
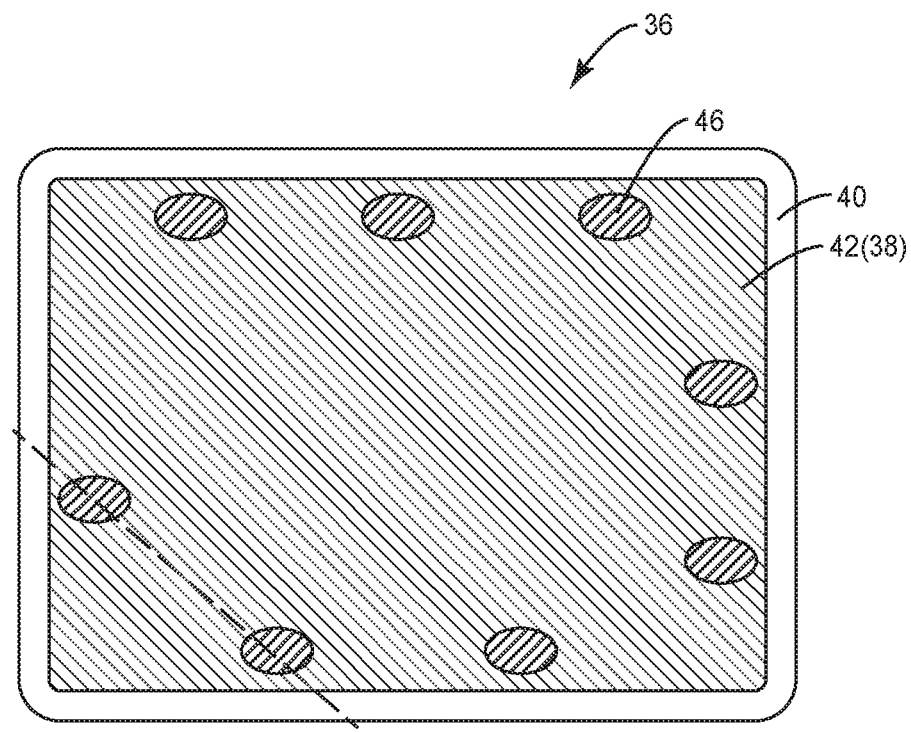
Figure 2B:
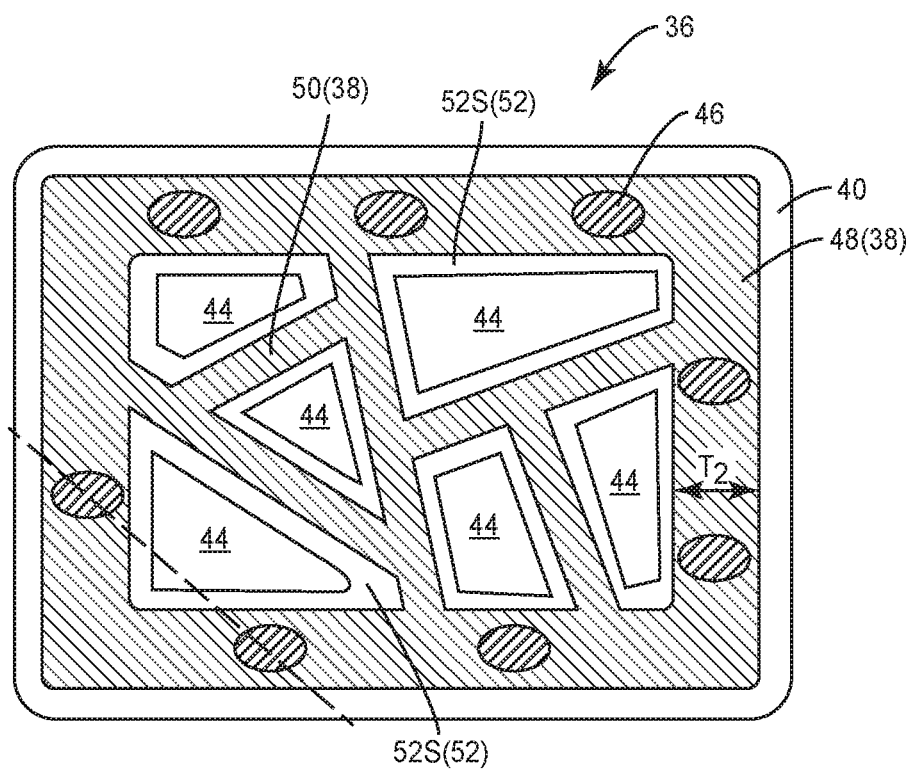
Figure 2C:
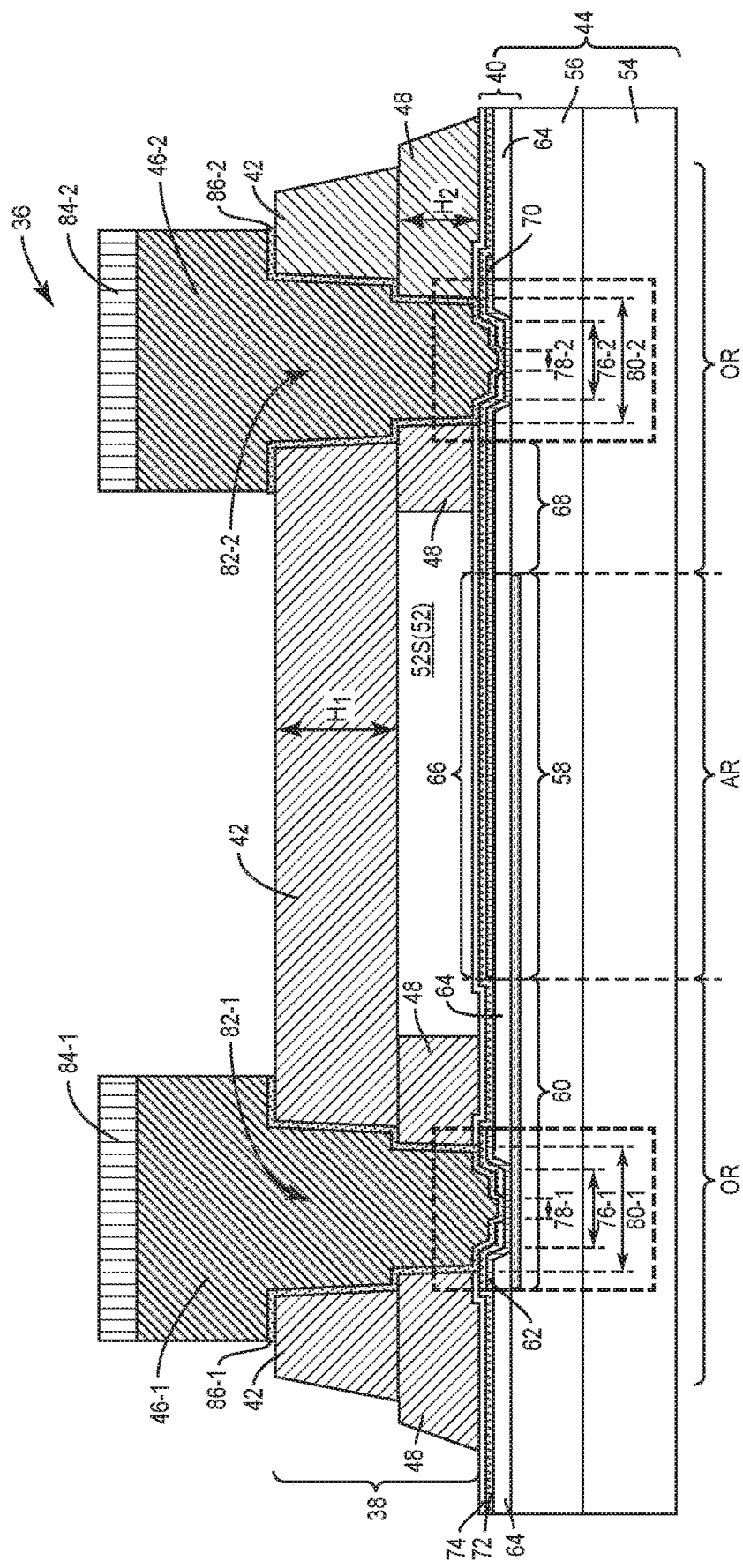

FIGS. 2A-2C provide an exemplary WLP BAW device according to one embodiment of the present disclosure.

Figure 3:
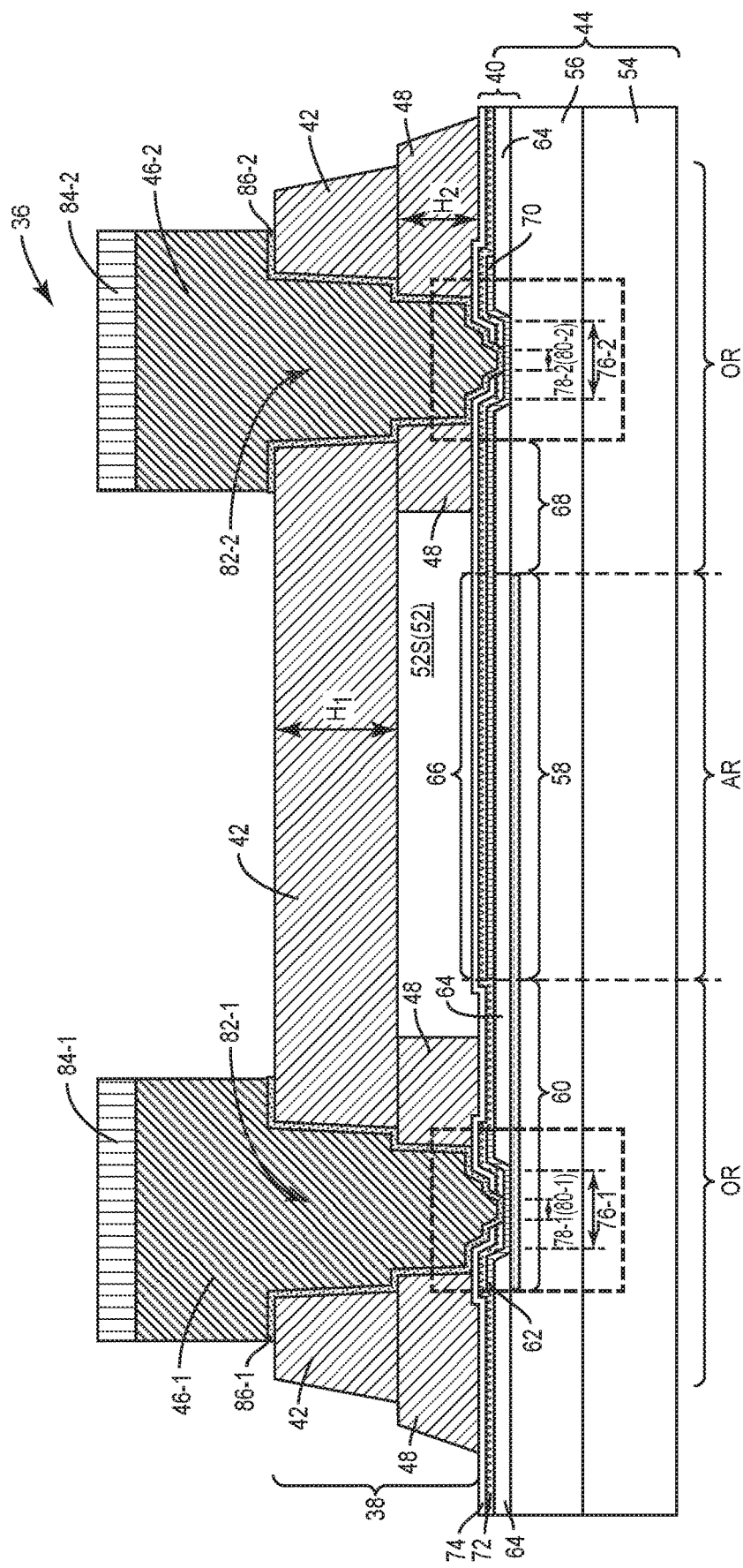

FIG. 3 provides an alternative WLP BAW device according to one embodiment of the present disclosure.

Figure 4:
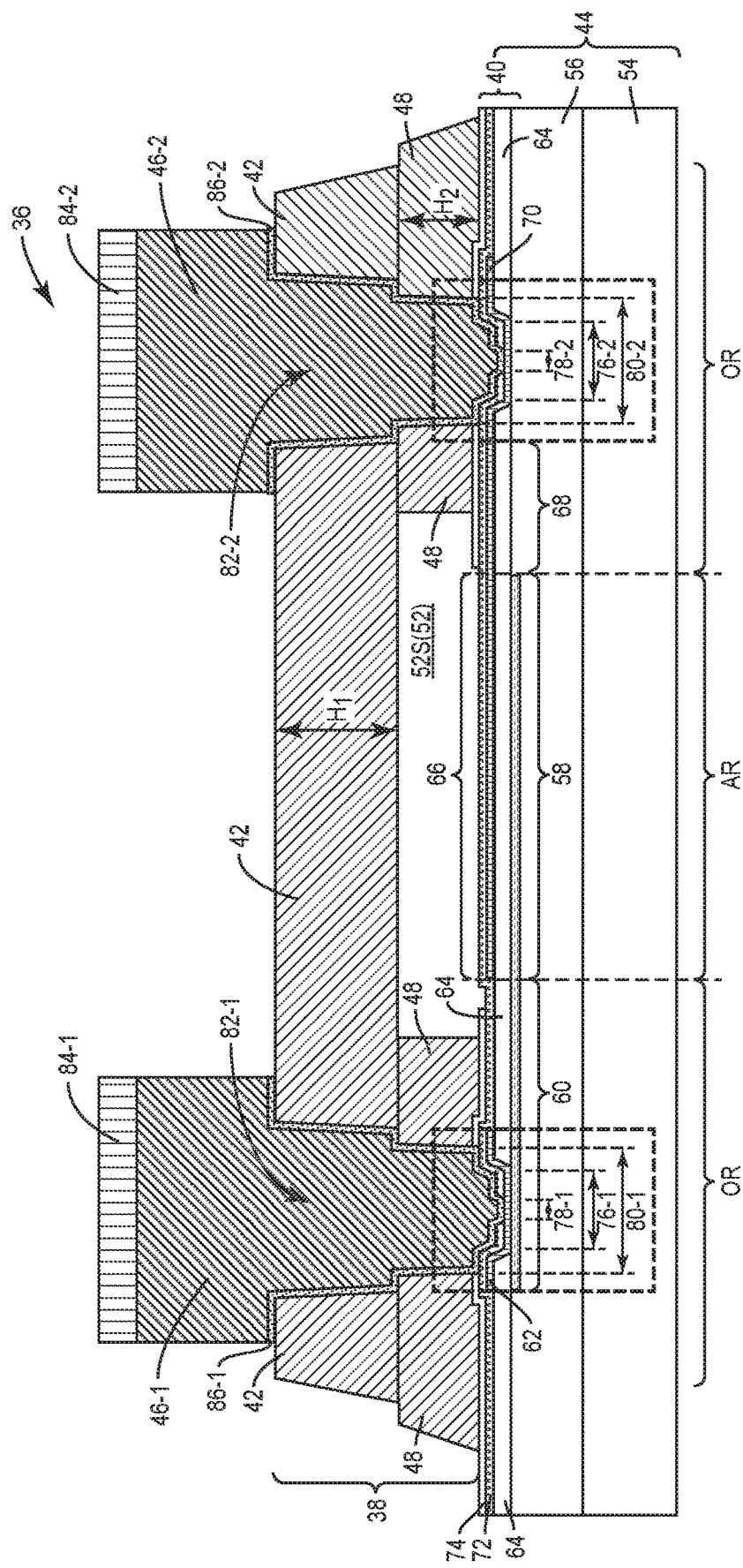

FIG. 4 provides an alternative WLP BAW device according to one embodiment of the present disclosure.

FIGS. 5A-5B provide layer-level details of connection configurations within the WLP BAW device shown in FIG. 2C.

FIGS. 6A-6B provide alternative layer-level details of connection configurations within the WLP BAW device shown in FIG. 2C.

FIGS. 7A-7B provide alternative layer-level details of connection configurations within the WLP BAW device shown in FIG. 2C.

It will be understood that for clear illustrations, FIGS. 1-7B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIGS. 2A-2C provide an exemplary Wafer-Level-Packaged (WLP) bulk acoustic wave (BAW) device 36 according to one embodiment of the present disclosure. FIG. 2A shows a top view of the WLP BAW device 36 that includes a WLP enclosure 38 formed over a common transducer region 40. FIG. 2B shows a top view of the WLP BAW device 36 under a WLP cap 42 of the WLP enclosure 38. For the purpose of this illustration, the WLP BAW device 36 includes six BAW resonators 44 sharing the common transducer region 40 (more details are described later), eight interconnects 46 (only one interconnect is labeled with a reference number for clarity), and the WLP enclosure 38. The WLP enclosure 38 includes the WLP cap 42, an outer wall 48, and inner walls 50 (only one inner wall is labeled with a reference number for clarity). The WLP cap 42 and the outer wall 50 form a large cavity 52, and the inner walls 50 divide the cavity 52 into six separate sub-cavities 52S (only two sub-cavities are labeled with reference numbers for clarity). Each BAW resonator 44 is encapsulated by the WLP enclosure 38 and resides in a corresponding sub-cavity 52S. Some BAW resonators 44 may be electrically connected, and some BAW resonators 44 may be electrically separated from others. Each interconnect 46 extends through the WLP cap 42 and the outer wall 48 (encompassed by the outer wall 48), and is electrically connected to a corresponding BAW resonator 44 (more details are described later). A top view of each interconnect 46 may be oval, circle, or other suitable shapes. In different applications, the WLP BAW device 36 may include fewer or more BAW resonators 44, and may include fewer or more interconnects 46. If there is only one BAW resonator 44 in the WLP BAW device 36, the inner walls 50 of the WLP enclosure 38 may be omitted.

FIG. 2C shows a cross-sectional view (along the dashed line in FIGS. 2A and 2B) of the WLP BAW device 36. The BAW resonator 44 includes a substrate 54, a reflector region 56 over the substrate 54, and the transducer region 40 over the reflector region 56. The substrate 54 may be formed of Silicon (Si). The reflector region 56 includes multiple alternating layers (not shown) of alternating materials with varying refractive index. In this embodiment, these multiple alternating layers may be formed of Silicon Dioxide and Tungsten (W). The transducer region 40 includes a bottom electrode 58, a bottom electrode lead 60, a first interface structure 62, a piezoelectric layer 64, a top electrode 66, a top electrode lead 68, a second interface structure 70, a passivation layer 72, and an oxide adhesion layer 74.

The bottom electrode 58 and the bottom electrode lead 60 are connected together, and formed on a bottom surface of the piezoelectric layer 64. The top electrode 66 and the top electrode lead 68 are connected together, and formed on a top surface of the piezoelectric layer 64. Herein, the top surface of the piezoelectric layer 64 is opposite the bottom surface of the piezoelectric layer 64. An active region AR for the BAW resonator 44 is formed where the bottom electrode 58 and the top electrode 66 overlap, and also includes the layers between and below the overlapping top and bottom electrodes 58 and 66. Other sections of the BAW resonator 44 that surround the active region AR are outside regions OR. The bottom electrode lead 60 and the top electrode lead 68 reside within the outside regions OR. In operation, acoustic waves in the piezoelectric layer 64 within the active region AR of the BAW resonator 44 are excited by an electrical signal applied to the bottom and/or top electrodes 58 and 66. The frequency at which resonance of the acoustic waves occurs is a function of the thickness of the reflector region 56, the piezoelectric layer 64, and the mass of the bottom and top electrodes 58 and 66.

In this embodiment, the piezoelectric layer 64 has eight interface openings 76 for the eight interconnects 46, which provide external electrical connections for the BAW resonator 44 (FIG. 2C only shows a first interface opening 76-1 and a second interface opening 76-2). A portion of the bottom electrode lead 60 is exposed through the first interface opening 76-1 of the piezoelectric layer 64. The first interface structure 62 extends over the first interface opening 76-1 and is in contact with the exposed portion of the bottom electrode lead 60. In some applications, the first interface structure 62 may cover exposed surfaces of the piezoelectric layer 64 within the first interface opening 76-1, and extend to the top surface of the piezoelectric layer 64. The second interface structure 70 extends from the top electrode lead 68 and extends over the second interface opening 76-2. In some applications, the second interface structure 70 may cover exposed surfaces within the second interface opening 76-2 and extend to the top surface of the piezoelectric layer 64. The first interface structure 62 and the second interface structure 70 reside within the outside regions OR.

The passivation layer 72 is formed over both the active region AR and the outside regions OR of the BAW resonator 44. Herein, the passivation layer 72 fully covers the top electrode 66, the top electrode lead 68, and exposed portions of the top surface of the piezoelectric layer 64 (through the top electrode 66, the top electrode lead 68, the first interface structure 62, and the second interface structure 70). However, the passivation layer 72 does not fully cover the first interface structure 62 or the second interface structure 70. In this embodiment, the passivation layer 72 has eight passivation openings 78, each of which is vertically aligned and above a corresponding interface opening 76 of the piezoelectric layer 64 (FIG. 2C only shows a first passivation opening 78-1 and a second passivation opening 78-2). A portion of the first interface structure 62, which is formed over the first interface opening 76-1, is exposed through the first passivation opening 78-1. A portion of the second interface structure 70, which is formed over the second interface opening 76-2, is exposed through the second passivation opening 78-2. The passivation layer 72 may be formed of Silicon Nitride (SiN) with a thickness between 10 Å and 5000 Å.

The oxide adhesion layer 74 is formed over at least a portion of the passivation layer 72, and has eight adhesion openings 80 (FIG. 2C only shows a first adhesion opening 80-1 and a second adhesion opening 80-2), each of which is vertically aligned and above a corresponding passivation opening 78 of the passivation layer 72. A width (i.e., diameter) of each adhesion opening 80 may be between 1.0 µm and 100 µm, a width of each passivation opening 78 may be between 1.0 µm and 100 µm, and a width of each interface opening 76 may be between 1.0 µm and 100 µm. In one embodiment, each adhesion opening 80 may be wider than the corresponding passivation opening 78 of the passivation layer 72. In addition, each passivation opening 78 may be no wider than the corresponding interface opening 76. As such, the portion of the first interface structure 62 formed across the first interface opening 76-1 is exposed through the first passivation opening 78-1 and the first adhesion opening 80-1. A portion of the passivation layer 72 is exposed through the first adhesion opening 80-1. The portion of the second interface structure 70 formed across the second interface opening 76-2 is exposed through the second passivation opening 78-2 and the second adhesion opening 80-2. Another portion of the passivation layer 72 is exposed through the second adhesion opening 80-2. The oxide adhesion layer 74 may be formed of Silicon oxide or oxynitride with a thickness between 50 Å and 75 Å, or between 20 Å and 900 Å.

The WLP enclosure 38 may be formed of TMMF, SU-8, or photo-definable epoxies. The WLP cap 42 has a height H1 between 5 µm and 60 µm, and the outer wall 48 has a height H2 between 5 µm and 60 µm. The outer wall 48 of the WLP enclosure 38 extends from the WLP cap 42 toward the top surface of the piezoelectric layer 64 to form the large cavity 52, and the inner walls 50 extend from the WLP cap 42 toward the top surface of the piezoelectric layer 64 to divide the large cavity 52 into separate sub-cavities 52S. The top electrode 66 of the BAW resonator 44 resides in the corresponding sub-cavity 52S. Herein, a bottom surface of the outer wall 48 and a bottom surface of each inner wall 50 (not shown in FIG. 2C) are in contact with the oxide adhesion layer 74. The oxide adhesion layer 74 provides superior adhesion to the passivation layer 72 and superior adhesion to the bottom surface of the outer wall 48/inner walls 50. If there is no oxide adhesion layer 74 between the bottom surface of the outer wall 48/inner walls 50 and the passivation layer 72 (formed of SiN), there might be undercutting or delamination between the passivation layer 72 and the WLP outer/inner walls 48/50, and the WLP enclosure 38 may not be adhered to the passivation layer 72 tightly. Consequently, chemicals in backend processes or mold compound during assembly may intrude into the sub-cavity 52S, and thus shift the performance of the WLP BAW device 36. In addition, during temperature cycling, the delamination between the WLP enclosure 38 and the passivation layer 72 may become even worse, and hence that may lead to delamination between the interconnect 46 and its corresponding interface structure, which will create an electrical failure.

In this embodiment, the WLP enclosure 38 also includes eight through-WLP vias 82 extending through the WLP cap 42 and the outer wall 48. Each through-WLP via 82 is encompassed by the outer wall 48, and is vertically aligned with a corresponding adhesion opening 80, a corresponding passivation opening 78, and a corresponding interface opening 76 (only a first through-WLP via 82-1 and a second through-WLP via 82-2 are shown in FIG. 2C). The portion of the first interface structure 62, which is formed across the first interface opening 76-1, is exposed to the bottom of the first through-WLP via 82-1, through the first passivation opening 78-1 and the first adhesion opening 80-1. The portion of the second interface structure 70, which is formed across the second interface opening 76-2, is exposed to the bottom of the second through-WLP via 82-2, through the second passivation opening 78-2 and the second adhesion opening 80-2. In this embodiment, there may be no portion of the oxide adhesion layer 74 exposed at the bottom of the first through-WLP via 82-1, and there may be portions of the passivation layer 72 around the first passivation opening 78-1 exposed at the bottom of the first through-WLP via 82-1. In addition, there may be no portion of the oxide adhesion layer 74 exposed at the bottom of the second through-WLP via 82-2, and there may be portions of the passivation layer 72 around the second passivation opening 78-2 exposed at the bottom of the second through-WLP via 82-2.

Each interconnect 46 extends through the WLP cap 42 and the outer wall 48, and fills the corresponding through-WLP via 82 (only a first interconnect 46-1 and a second interconnect 46-2 are shown in FIG. 2C). Herein, the first interconnect 46-1 fills the first through-WLP via 82-1 and is electrically connected to the first interface structure 62, which extends over the first interface opening 76-1 of the piezoelectric layer 64 and is exposed through the first passivation opening 78-1 and the first adhesion opening 80-1. The second interconnect 46-2 fills the second through-WLP via 82-2 and is electrically connected to the second interface structure 70, which extends over the second interface opening 76-2 of the piezoelectric layer 64 and is exposed through the second passivation opening 78-2 and the second adhesion opening 80-2. Unlike the conventional WLP BAW device 10 shown in FIG. 1, the WLP BAW device 36 does not require extra space between the outer wall 48 of the WLP enclosure 38 and the interconnects 46 for external connections. Instead, each interconnect 46 is confined within the outer wall 48. Consequently, the size of the WLP BAW device 36 will be reduced compared to the conventional WLP BAW device 10. In some applications, a portion of each interconnect 46 may reside over the WLP cap 42 and there is a solder cap 84 formed over the corresponding interconnect 46 (only a first solder cap 84-1 and a second solder cap 84-2 are shown in FIG. 2C). The solder cap 84 may be formed of Tin (Sn).

In order to improve deposition of the interconnects 46, there may be a continuous seed layer 86 formed for each interconnect 46 (only a first seed layer 86-1 and a second seed layer 86-2 are shown in FIG. 2C). The first seed layer 86-1 continuously extends over exposed surfaces within the first through-WLP via 82-1, such that the first seed layer 86-1 is in contact with exposed surfaces of the WLP enclosure 38 within the first through-WLP via 82-1, in contact with the exposed portions of the passivation layer 72 at the bottom of the first through-WLP via 82-1, and in contact with the exposed portion of the first interface structure 62 at the bottom of the first through-WLP via 82-1. The first interconnect 46-1 is formed over the first seed layer 86-1, such that the first interconnect 46-1 is electrically connected to the first interface structure 62 through the first seed layer 86-1. The second seed layer 86-2 continuously extends over exposed surfaces within the second through-WLP via 82-2, such that the second seed layer 86-2 is in contact with exposed surfaces of the WLP enclosure 38 within the second through-WLP via 82-2, in contact with the exposed portions of the passivation layer 72 at the bottom of the second through-WLP via 82-2, and in contact with the exposed portion of the second interface structure 70 at the bottom of the second through-WLP via 82-2. The second interconnect 46-2 is formed over the second seed layer 86-2, such that the second interconnect 46-2 is electrically connected to the second interface structure 70 through the second seed layer 86-2. If there is no seed layer 86, each interconnect 46 will be directly connected to the corresponding interface structure. The seed layer 86 may be formed of Titanium (Ti) or Titanium Tungsten (TiW). The interconnects 46 may be formed of copper (Cu), Tin (Sn), or Tin Silver (SnAg).

In one embodiment, the transducer region 40 of the BAW resonator 44 may not include the first interface structure 62. The bottom electrode 58 may be connected to another bottom electrode in an adjacent sub-cavity 52S by the bottom electrode lead 60 (not shown). As such, there is no first interconnect 46-1 needed to provide an external electrical connection for the bottom electrode 58. Consequently, there is no first through-WLP via 82-1 through the WLP cap 42 and the outer wall 48, and there is no first seed layer 86-1 that extends over exposed surfaces within the first through-WLP via 82-1. In another embodiment, the transducer region 40 of the BAW resonator 44 may not include the second interface structure 70. The top electrode 66 may be connected to another top electrode in an adjacent sub-cavity 52S by the top electrode lead 68 (not shown). As such, there is no second interconnect 46-2 needed to provide an external electrical connection for the top electrode 66. Consequently, there is no second through-WLP via 82-2 through the WLP cap 42 and the outer wall 48, and there is no second seed layer 86-2 that extends over exposed surfaces within the second through-WLP via 82-2.

In some applications, the oxide adhesion layer 74 fully covers the passivation layer 72, as illustrated in FIG. 3. As such, each adhesion opening 80 of the oxide adhesion layer 74 and the corresponding passivation opening 78 of the passivation layer 72 may have essentially a same size. There may be portions of the oxide adhesion layer 74 around the first adhesion opening 80-1 exposed at the bottom of the first through-WLP via 82-1, but no portion of the passivation layer 72 is exposed. There may be portions of the oxide adhesion layer 74 around the second adhesion opening 80-2 exposed at the bottom of the second through-WLP via 82-2, but no portion of the passivation layer 72 is exposed. In addition, the first seed layer 86-1 is in contact with exposed surfaces of the WLP enclosure 38 within the first through-WLP via 82-1, in contact with the exposed portions of the oxide adhesion layer 74 at the bottom of the first through-WLP via 82-1, and in contact with the exposed portion of the first interface structure 62 at the bottom of the first through-WLP via 82-1. The second seed layer 86-2 is in contact with exposed surfaces of the WLP enclosure 38 within the second through-WLP via 82-2, in contact with the exposed portions of the oxide adhesion layer 74 at the bottom of the second through-WLP via 82-2, and in contact with the exposed portion of the second interface structure 70 at the bottom of the second through-WLP via 82-2.

In some applications, the oxide adhesion layer 74 may only be formed underneath and around the outer wall 48 and inner walls 50 of the WLP enclosure 38, as illustrated in FIG. 4. Herein, the oxide adhesion layer 74 may not cover portions of the passivation layer 72 within the sub-cavities 52S. Since the oxide adhesion layer 74 is configured to provide a superior attachment between the WLP enclosure 38 and the passivation layer 72, the outer wall 48 and the inner walls 50 must be confined within the oxide adhesion layer 74.

FIGS. 5A-5B provide layer-level details of connection configurations within dashed boxes of the WLP BAW device 36 shown in FIG. 2C. FIG. 5A illustrates the connection configurations around the first interface structure 62. Herein, the bottom electrode 58 (not shown in FIG. 5A) and the bottom electrode lead 60 are formed from a common first bottom electrode layer 88 and a common second bottom electrode layer 90. The first bottom electrode layer 88 is formed over the bottom surface of the piezoelectric layer 64, and a portion of the first bottom electrode layer 88 is exposed through the first interface opening 76-1. The second bottom electrode layer 90 is formed between the first bottom electrode layer 88 and the reflector region 56. In addition, there may be a bottom seed layer (not shown) formed between the first bottom electrode layer 88 and the second bottom electrode layer 90. The first bottom electrode layer 88 may be formed of W, Molybdenum (Mo), or other electrically conductive materials with a high acoustic impedance property, and the second bottom electrode layer 90 may be formed of Aluminum Copper (AlCu) or other highly electrically conductive materials. The first bottom electrode layer 88 has a thickness between 100 Å and 10000 Å, and the second bottom electrode layer 90 has a thickness between 100 Å and 10000 Å.

The first interface structure 62 includes a lower interface layer 92, a middle interface layer 94, and an upper interface layer 96. The lower interface layer 92 extends over the first interface opening 76-1 and is in contact with the exposed portion of the first bottom electrode layer 88 through the first interface opening 76-1. In some applications, the lower interface layer 92 may cover the exposed surfaces of the piezoelectric layer 64 within the first interface opening 76-1, and may extend to the top surface of the piezoelectric layer 64. The middle interface layer 94 is formed over the lower interface layer 92, and the upper interface layer 96 is formed over the middle interface layer 94. The passivation layer 72 is over the upper interface layer 96, and the oxide adhesion layer 74 is formed over the passivation layer 72. In addition, a portion of the upper interface layer 96 is exposed to the first through-WLP via 82-1 of the WLP enclosure 38 through the first passivation opening 78-1 of the passivation layer 72 and the first adhesion opening 80-1 of the oxide adhesion layer 74. As such, the first seed layer 86-1 or the first interconnect 46-1 (if there is no seed layer) is in contact with the exposed portion of the upper interface layer 96. The lower interface layer 92 may be formed of W or Mo with a thickness between 100 Å and 10000 Å, the middle interface layer 94 may be formed of AlCu with a thickness between 100 Å and 10000 Å, and the upper interface layer 96 may be formed of W or Mo with a thickness between 100 Å and 10000 Å.

FIG. 5B illustrates the connection configurations around the second interface structure 70. Herein, the top electrode 66 (not shown in FIG. 5B), the top electrode lead 68 (not shown in FIG. 5B), and the second interface structure 70 are formed from a common first top electrode layer 98, a common second top electrode layer 100, and a common third top electrode layer 102. The first top electrode layer 98 extends over a portion of the top surface of the piezoelectric layer 64 (at least for the top electrode 66 and the top electrode lead 68), and over exposed surfaces of the piezoelectric layer 64 within the second interface opening 76-2. The second top electrode layer 100 is formed over the first top electrode layer 98, and the third top electrode layer 102 is formed over the second top electrode layer 100. The passivation layer 72 is over the third top electrode layer 102, and the oxide adhesion layer 74 is formed over the passivation layer 72. A portion of the third top electrode layer 102 is exposed to the second through-WLP via 82-2 of the WLP enclosure 38 through the second passivation opening 78-2 of the passivation layer 72 and the second adhesion opening 80-2 of the oxide adhesion layer 74. As such, the second seed layer 86-2 or the second interconnect 46-2 (if there is no seed layer) is in contact with the exposed portion of the third top electrode layer 102. The first top electrode layer 98 may be formed of W or Mo with a thickness between 100 Å and 10000 Å, the second top electrode layer 100 may be formed of AlCu with a thickness between 100 Å and 10000 Å, and the third top electrode layer 102 may be formed of W or Mo with a thickness between 100 Å and 10000 Å.

FIGS. 6A-6B provide alternative layer-level details of connection configurations within the dashed boxes of the WLP BAW device 36 shown in FIG. 2C. The first interface structure 62 still includes the lower interface layer 92, the middle interface layer 94, and the upper interface layer 96. Herein, the upper interface layer 96 includes a first layer opening 104 vertically aligned with the first passivation opening 78-1 of the passivation layer 72. The first layer opening 104 of the upper interface layer 96 has essentially a same size as the first passivation opening 78-1 of the passivation layer 72. As such, a portion of the middle interface layer 94 is exposed to the first through-WLP via 82-1 of the WLP enclosure 38 through the first layer opening 104 of the upper interface layer 96, the first passivation opening 78-1 of the passivation layer 72, and the first adhesion opening 80-1 of the oxide adhesion layer 74. Consequently, the first seed layer 86-1 or the first interconnect 46-1 (if there is no seed layer) is in contact with the exposed portion of the middle interface layer 94.

Similarly, the third top electrode layer 102 of the second interface structure 70 includes a second layer opening 106 vertically aligned with the second passivation opening 78-2 of the passivation layer 72. The second layer opening 106 of the third top electrode layer 102 is essentially a same size as the second passivation opening 78-2 of the passivation layer 72. As such, a portion of the second top electrode layer 100 is exposed to the second through-WLP via 82-2 of the WLP enclosure 38 through the second layer opening 106 of the third top electrode layer 102, the second passivation opening 78-2 of the passivation layer 72, and the second adhesion opening 80-2 of the oxide adhesion layer 74. Consequently, the second seed layer 86-2 or the second interconnect 46-2 (if there is no seed layer) is in contact with the exposed portion of the second top electrode layer 100.

In another embodiment, the upper interface layer 96 and the middle interface layer 94 of the first interface structure 62 have the first layer opening 104 and a third layer opening 108, respectively, as illustrated in FIG. 7A. The first layer opening 104 of the upper interface layer 96 and the third layer opening 108 of the middle interface layer 94 are vertically aligned with the first passivation opening 78-1 of the passivation layer 72. The first layer opening 104 of the upper interface layer 96 and the third layer opening 108 of the middle interface layer 94 have essentially the same size as the first passivation opening 78-1 of the passivation layer 72. As such, a portion of the lower interface layer 92 is exposed to the first through-WLP via 82-1 of the WLP enclosure 38 through the third layer opening 108 of the middle interface layer 94, the first layer opening 104 of the upper interface layer 96, the first passivation opening 78-1 of the passivation layer 72, and the first adhesion opening 80-1 of the oxide adhesion layer 74. Consequently, the first seed layer 86-1 or the first interconnect 46-1 (if there is no seed layer) is in contact with the exposed portion of the lower interface layer 92.

In FIG. 7B, the third top electrode layer 102 and the second top electrode layer 100 of the second interface structure 70 have the second layer opening 106 and a fourth layer opening 110, respectively. The second layer opening 106 of the third top electrode layer 102 and the fourth layer opening 110 of the second top electrode layer 100 are vertically aligned with the second passivation opening 78-2 of the passivation layer 72 and the second adhesion opening 80-2 of the oxide adhesion layer 74. The second layer opening 106 of the third top electrode layer 102 and the fourth layer opening 110 of the second top electrode layer 100 have essentially the same size as the second passivation opening 78-2 of the passivation layer 72. As such, a portion of the first top electrode layer 98 is exposed to the second through-WLP via 82-2 of the WLP enclosure 38 through the fourth layer opening 110 of the second top electrode layer 100, the second layer opening 106 of the third top electrode layer 102, the second passivation opening 78-2 of the passivation layer 72, and the second adhesion opening 80-2 of the oxide adhesion layer 74. Consequently, the second seed layer 86-2 or the second interconnect 46-2 (if there is no seed layer) is in contact with the exposed portion of the first top electrode layer 98.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a piezoelectric layer with a first interface opening;
   a first interface structure extending over the first interface opening;
   a wafer-level-packaged (WLP) enclosure comprising an outer wall and a first through-WLP via, wherein the first through-WLP via is encompassed by the outer wall;
   a passivation layer, which is formed of Silicon Nitride (SiN), directly over a portion of a top surface of the piezoelectric layer and having a first passivation opening over the first interface structure; and
   an oxide adhesion layer directly over at least a portion of the passivation layer and having a first adhesion opening, wherein:
   the first through-WLP via, the first adhesion opening, and the first passivation opening are vertically aligned, such that at least a portion of the first interface structure is exposed to the first through-WLP via through the first passivation opening and the first adhesion opening; and
   the outer wall is confined within the oxide adhesion layer, such that a bottom surface of the outer wall is in contact with the oxide adhesion layer.

2. The apparatus of claim 1 further comprising a bottom electrode and a bottom electrode lead, wherein:
   the bottom electrode and the bottom electrode lead are over a bottom surface of the piezoelectric layer; and
   the bottom electrode lead extends from the bottom electrode;
   a portion of the bottom electrode lead is exposed through the first interface opening and in contact with the first interface structure.

3. The apparatus of claim 2 wherein the WLP enclosure further comprises a WLP cap, wherein, the outer wall extends from the WLP cap toward the top surface of the piezoelectric layer to form a cavity; and the first through-WLP via extends vertically through the WLP cap and the outer wall.

4. The apparatus of claim 3 further comprising a top electrode that resides over the top surface of the piezoelectric layer and within the cavity, wherein:

the top surface of the piezoelectric layer is opposite the bottom surface of the piezoelectric layer; and an active region for a resonator is formed where the bottom electrode and the top electrode overlap.

5. The apparatus of claim 4 wherein the passivation layer is further directly over exposed surfaces of the top electrode.

6. The apparatus of claim 5 wherein the oxide adhesion layer fully covers the passivation layer.

7. The apparatus of claim 5 wherein the oxide adhesion layer does not fully cover the passivation layer.

8. The apparatus of claim 4 further comprising a first interconnect formed in the first through-WLP via and electrically connected to the first interface structure.

9. The apparatus of claim 8 further comprising a first seed layer, wherein:

the first seed layer continuously extends over exposed surfaces within the first through-WLP via, such that the first seed layer is in contact with the exposed portion of the first interface structure through the first adhesion opening and the first passivation opening; and the first interconnect is formed over the first seed layer.

10. The apparatus of claim 9 wherein the first seed layer is formed of Titanium (Ti) or Titanium Tungsten (TiW).

11. The apparatus of claim 1 wherein the oxide adhesion layer is formed of Silicon oxide or oxynitride.

12. The apparatus of claim 11 wherein a thickness of the oxide adhesion layer is between 50 Å and 75 Å.

13. The apparatus of claim 11 wherein a thickness of the oxide adhesion layer is between 20 Å and 900 Å.

14. The apparatus of claim 1 wherein a width of the first passivation opening is essentially the same as a width of the first adhesion opening, and is no greater than a width of the first interface opening.

15. The apparatus of claim 1 wherein a thickness of the passivation layer is between 10 Å and 5000 Å.

16. The apparatus of claim 1 wherein the first interconnect is formed of copper (Cu), Tin (Sn), or Tin Silver (SnAg).

17. The apparatus of claim 2 wherein the first interface structure comprises a lower interface layer, a middle interface layer, and an upper interface layer, wherein:

the lower interface layer extends over the first interface opening of the piezoelectric layer and is in contact with the exposed portion of the bottom electrode lead;

the middle interface layer is formed over the lower interface layer, and the upper interface layer is formed over the middle interface layer;

a portion of the upper interface layer is exposed to the first through-WLP via through the first passivation opening and the first adhesion opening; and the lower interface layer is formed of Tungsten (W) or Molybdenum (Mo), the middle interface layer is formed of Aluminum Copper (AlCu), and the upper interface layer is formed of W or Mo.

18. The apparatus of claim 16 wherein:

the lower interface layer has a thickness between 100 Å and 10000 Å;

the middle interface layer has a thickness between 100 Å and 10000 Å; and the upper interface layer has a thickness between 100 Å and 10000 Å.

19. The apparatus of claim 17 wherein the bottom electrode and the bottom electrode lead are formed from a common first bottom electrode layer and a common second bottom electrode layer, wherein:

the first bottom electrode layer is formed over the bottom surface of the piezoelectric layer, and a portion of the first bottom electrode layer is in contact with the lower interface layer of the first interface structure through the first interface opening of the piezoelectric layer;

the second bottom electrode layer is formed underneath the first bottom electrode layer; and the first bottom electrode layer is formed of W or Mo, and the second bottom electrode layer is formed of AlCu.

20. The apparatus of claim 19 wherein:

the first bottom electrode layer has a thickness between 100 Å and 10000 Å; and the second bottom electrode layer has a thickness between 100 Å and 10000 Å.

21. The apparatus of claim 2 wherein the first interface structure comprises a lower interface layer, a middle interface layer, and an upper interface layer, wherein:

the lower interface layer extends over the first interface opening of the piezoelectric layer and is in contact with the exposed portion of the bottom electrode lead;

the middle interface layer is formed over the lower interface layer, and the upper interface layer with a layer opening formed over the middle interface layer;

the layer opening of the upper interface layer is vertically aligned with the first passivation opening and the first adhesion opening, and has essentially a same size as the first passivation opening;

a portion of the middle interface layer is exposed to the first through-WLP via of the WLP enclosure through the layer opening of the upper interface layer, the first passivation opening, and the first adhesion opening; and the lower interface layer is formed of W or Mo, the middle interface layer is formed of AlCu, and the upper interface layer is formed of W or Mo.

22. The apparatus of claim 2 wherein the first interface structure comprises a lower interface layer, a middle interface layer, and an upper interface layer, wherein:

the lower interface layer extends over the first interface opening of the piezoelectric layer and is in contact with the exposed portion of the bottom electrode lead;

the middle interface layer with a first layer opening is formed over the lower interface layer, and the upper interface layer with a second layer opening is formed over the middle interface layer;

the first layer opening of the middle interface layer and the second layer opening of the upper interface layer are vertically aligned with the first passivation opening and the first adhesion opening;

the first layer opening of the middle interface layer and the second layer opening of the upper interface layer have essentially a same size as the first passivation opening;

a portion of the lower interface layer is exposed to the first through-WLP via of the WLP enclosure through the first layer opening of the middle interface layer, the second layer opening of the upper interface layer, the first passivation opening, and the first adhesion opening; and the lower interface layer is formed of W or Mo, the middle interface layer is formed of AlCu, and the upper interface layer is formed of W or Mo.

23. The apparatus of claim 4 further comprising a top electrode lead, and a second interface structure, wherein:

the piezoelectric layer further includes a second interface opening;

the top electrode lead is formed over the top surface of the piezoelectric layer and extends from the top electrode;

the second interface structure extends from the top electrode lead, and extends over the second interface opening of the piezoelectric layer;

the WLP enclosure further includes a second through-WLP via, wherein the second through-WLP via extends vertically through the WLP cap and the outer wall, is encompassed by the outer wall, the passivation layer further includes a second passivation opening over the second interface structure; and the oxide adhesion layer further includes a second adhesion opening, wherein the second through-WLP via, the second adhesion opening, and the second passivation opening are vertically aligned, such that at least a portion of the second interface structure is exposed to the second through-WLP via through the second passivation opening and the second adhesion opening.

24. The apparatus of claim 23 wherein the passivation layer further directly over exposed surfaces of the top electrode and the top electrode lead.

25. The apparatus of claim 23 further comprising a first interconnect formed in the first through-WLP via and electrically connected to the first interface structure, and a second interconnect formed in the second through-WLP via and electrically connected to the second interface structure.

26. The apparatus of claim 25 further comprising a first seed layer and a second seed layer, wherein:

the first seed layer continuously extends over exposed surfaces within the first through-WLP via, such that the first seed layer is in contact with the exposed portion of the first interface structure through the first passivation opening and the first adhesion opening;

the first interconnect is formed over the first seed layer;

the second seed layer continuously extends over exposed surfaces within the second through-WLP via, such that the second seed layer is in contact with the exposed portion of the second interface structure through the second passivation opening and the second adhesion opening; and the second interconnect is formed over the second seed layer.

27. An apparatus comprising:

a piezoelectric layer with an interface opening;

an interface structure extending over the interface opening;

a wafer-level-packaged (WLP) enclosure comprising an outer wall and a through-WLP via, wherein the through-WLP via is encompassed by the outer wall; and a passivation layer, which is formed of SiN, directly over a portion of a top surface of the piezoelectric layer, and having a passivation opening over the interface structure; and an oxide adhesion layer directly over at least a portion of the passivation layer and having an adhesion opening, wherein:

the through-WLP via, the adhesion opening, and the passivation opening are vertically aligned, such that at least a portion of the interface structure is exposed to the through-WLP via through the passivation opening and the adhesion opening; and the outer wall is confined within the oxide adhesion layer, such that a bottom surface of the outer wall is in contact with the oxide adhesion layer.

28. The apparatus of claim 27 further comprises a top electrode and a top electrode lead, wherein:

the top electrode and the top electrode lead are over the top surface of the piezoelectric layer;

top electrode lead extends from the top electrode, and the interface structure extends from the top electrode; and the passivation layer is directly over the top electrode and the top electrode lead.

29. The apparatus of claim 28 wherein the top electrode, the top electrode lead, and the interface structure are formed from a common first top electrode layer, a common second top electrode layer, and a common third top electrode layer, wherein:

the first top electrode layer extends over a portion of the top surface of the piezoelectric layer and over the interface opening;

the second top electrode layer is formed over the first top electrode layer, and the third top electrode layer is formed over the second top electrode layer;

a portion of the third top electrode layer is exposed to the through-WLP via through the passivation opening and the adhesion opening; and the first top electrode layer is formed of W or Mo, the second top electrode layer is formed of AlCu, and the third top electrode layer is formed of W or Mo.

30. The apparatus of claim 28 further comprising a seed layer and an interconnect wherein:

the seed layer continuously extends over exposed surfaces within the through-WLP via, such that the seed layer is in contact with the exposed portion of the interface structure through the passivation opening and the adhesion opening; and the interconnect is formed over the seed layer, such that the interconnect is electrically connected to the interface structure.

31. The apparatus of claim 27 wherein the oxide adhesion layer is formed of Silicon oxide or oxynitride.

* * * * *